(12) United States Patent
Stolt et al.

(10) Patent No.: US 8,399,177 B2
(45) Date of Patent: Mar. 19, 2013

(54) ENHANCED RELIEF PRINTING PLATE

(75) Inventors: Peter Stolt, Edina, MN (US); Gregory L. Zwadlo, River Falls, WI (US); William A. Rozzi, Stillwater, MN (US)

(73) Assignee: Eastman Kodak Company, Rochester, NY (US)

( * ) Notice: Subject to any disclaimer, the term of this patent is extended or adjusted under 35 U.S.C. 154(b) by 849 days.

(21) Appl. No.: 12/329,837

(22) Filed: Dec. 8, 2008

(65) Prior Publication Data
US 2010/0143841 A1    Jun. 10, 2010

(51) Int. Cl.
*G03F 1/00* (2006.01)
*G03F 7/00* (2006.01)
(52) U.S. Cl. ............................. 430/306; 430/5
(58) Field of Classification Search ............ 430/306
See application file for complete search history.

(56) References Cited

U.S. PATENT DOCUMENTS

| | | | |
|---|---|---|---|
| 6,063,546 A | 5/2000 | Gelbart | |
| 6,492,095 B2 | 12/2002 | Samworth | |
| 6,701,847 B2 | 3/2004 | Weichmann | |
| 6,731,405 B2 | 5/2004 | Samworth | |
| 7,279,254 B2 | 10/2007 | Zwadlo | |
| 2003/0218780 A1* | 11/2003 | Braun et al. | 358/3.12 |
| 2005/0227182 A1* | 10/2005 | Ali et al. | 430/311 |
| 2006/0096479 A1* | 5/2006 | McCrea et al. | 101/401.1 |
| 2006/0257780 A1* | 11/2006 | Zwadlo | 430/270.1 |
| 2007/0002384 A1 | 1/2007 | Samworth et al. | |
| 2007/0081194 A1* | 4/2007 | McCrea et al. | 358/300 |
| 2009/0042138 A1* | 2/2009 | Roberts et al. | 430/300 |

FOREIGN PATENT DOCUMENTS

| | | |
|---|---|---|
| DE | 43 24 577 C1 | 12/1994 |
| DE | 4324577 C1 * | 12/1994 |
| GB | 2 241 352 A | 8/1991 |

\* cited by examiner

*Primary Examiner* — Cynthia Kelly
*Assistant Examiner* — Chanceity Robinson
(74) *Attorney, Agent, or Firm* — Nelson Arinan Blish

(57) ABSTRACT

An improved relief printing plate and method for producing said plate is disclosed. Substantially all sizes of relief features resolve a fixed pattern which improves print quality. The pattern is applied to image areas in halftone data used to produce an image mask that is subsequently used to convert a plate precursor into a relief plate. The accuracy, ink density and tonal response of printed images corresponding to relief features that include the pattern are comparable or better than relief features produced without the pattern.

10 Claims, 16 Drawing Sheets

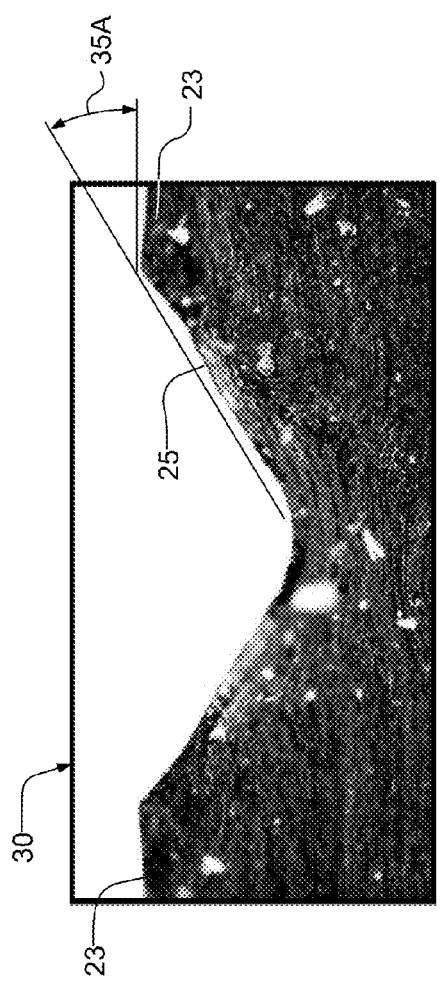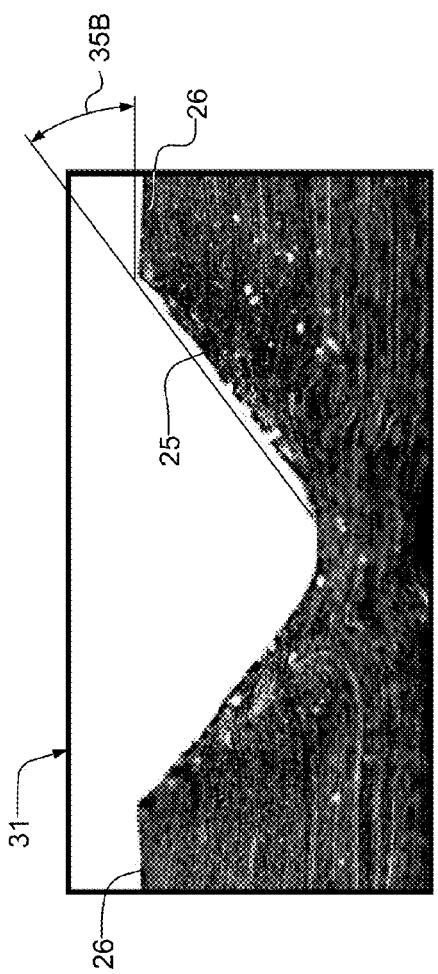

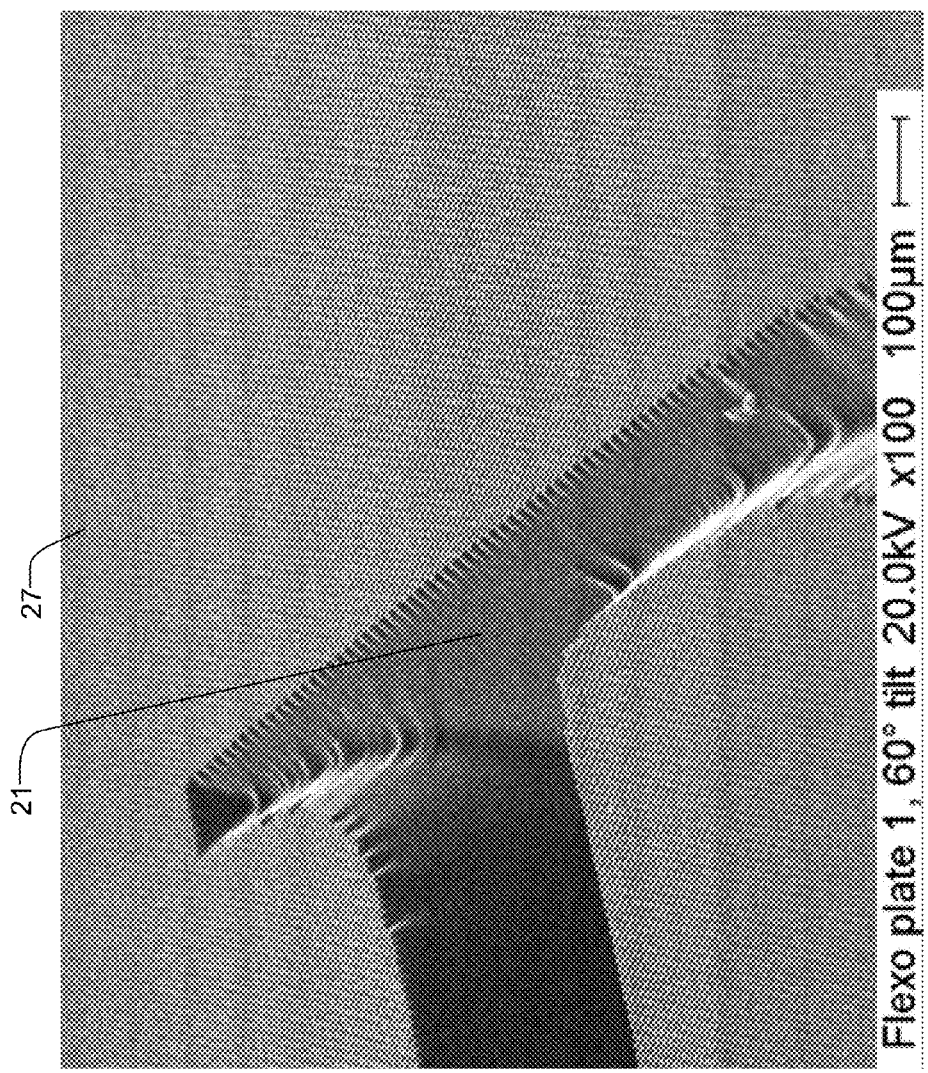

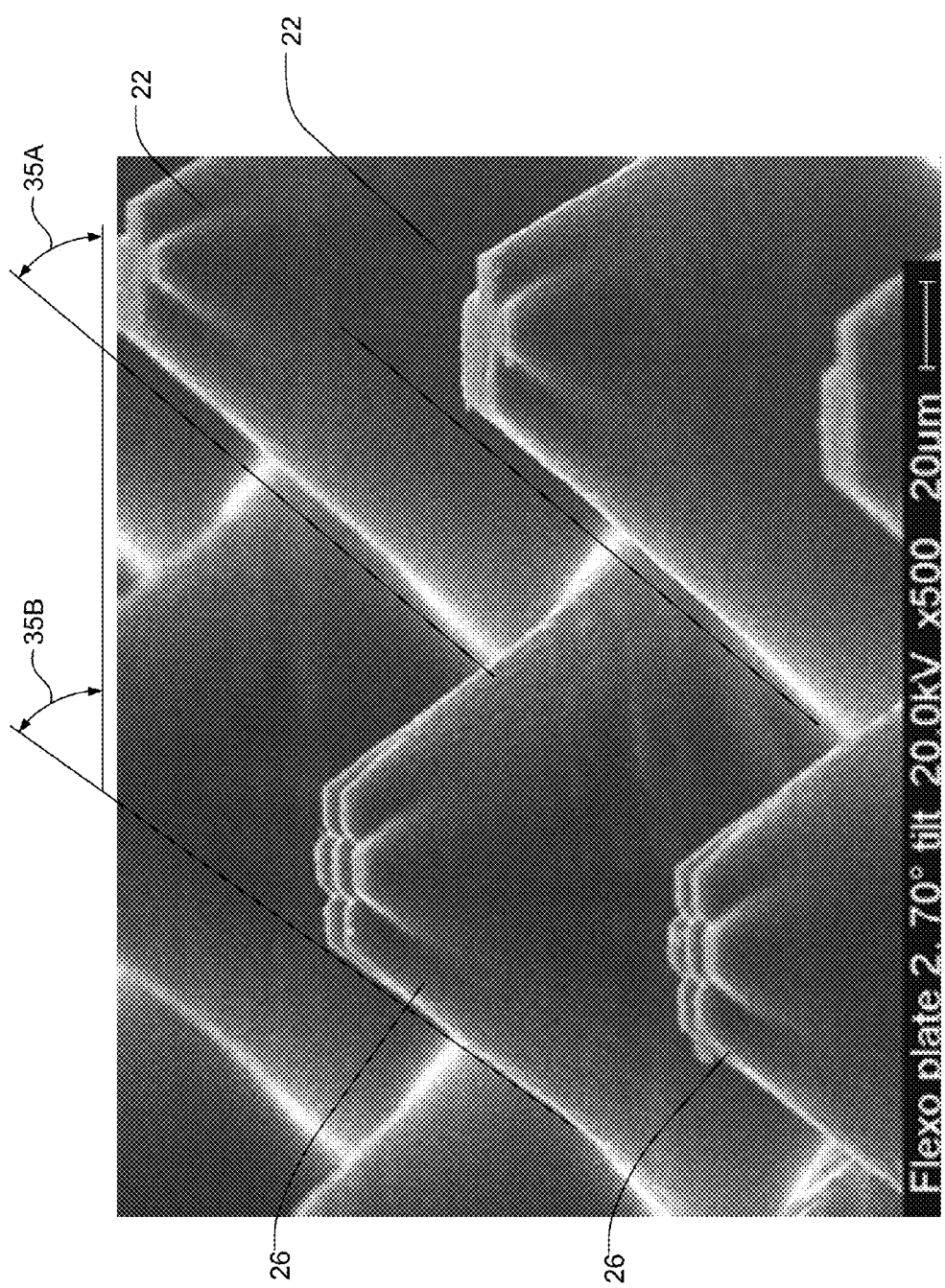

ENHANCED RELIEF PRINTING PLATE

FIELD OF THE INVENTION

The present invention pertains to relief printing and in particular to preparation of an enhanced relief printing plate.

BACKGROUND OF THE INVENTION

Flexography, which is one example of relief printing, produces an image on a substrate by transferring ink from the surface of a relief plate, representing the image, directly to a substrate. Relief features in a flexographic plate are typically formed by subjecting a plate precursor to a curing radiation (e.g. ultraviolet light) through an image-wise mask and then developing the precursor to wash away parts of the plate that have not received sufficient curing radiation. The resulting relief features typically comprise solid areas and halftone dots of varying sizes and/or quantities per area to represent a range of tones specified by the image data. For example, a highlight tone can be represented by an array of very small relief dots in an area, a shadow tone can be represented by an array of large dots in an area, and a full tone can be represented by a solid relief area.

A number of challenges exist in preparing and printing with relief plates. One challenge is to produce relief features that accurately represent image features. Another challenge is to transfer an optimal quantity of ink from relief features so that printed ink densities on the substrate have a wide range and relatively linear correlation with image tonality. Another challenge is to transfer ink with a uniform density to the substrate so that areas representing a specific image tonality have a consistent appearance. The prior art teaches a number of techniques to address individual challenges, as described below. However, similar techniques appear to produce a variety of results.

U.S. Pat. No. 6,063,546 (Gelbart) teaches the use of a mask with varying optical density to control the amount of curing radiation delivered to individual plate precursor features. In particular, Gelbart teaches that relief feature accuracy can be improved by allowing a full exposure for highlight features, and gradually reducing exposure as tonality increases to some optimal level for full tone features. Gelbart teaches an analog method for varying optical density. For example, one or more layers of UV light-absorbing mask material can be removed to provide partial transparency for an image feature in a mask. Gelbart also teaches a digital method for varying optical density. For example, Gelbart teaches an area modulation technique involving a pseudo-random distribution of opaque features in an image area of a mask to effect an average reduction in exposure for the corresponding relief feature. Gelbart teaches that these opaque features should be small enough that upon exposure and developing they are not resolved in the relief plate (e.g. as relief holes).

U.S. Pat. No. 7,279,254 (Zwadlo) teaches laminating a mask to a plate precursor prior to exposure to improve the accuracy of relief features. It is believed that laminating reduces the gap between the mask and precursor so that curing radiation is less likely to scatter into areas of the precursor surrounding a transparent area of the mask. Zwadlo also teaches using a mask that includes a transparent substrate layer as a barrier. It is believed that laminating such a mask on a precursor prevents oxygen from reaching the plate precursor during exposure. In the presence of oxygen, some plate precursor materials require higher exposure levels to cure and thus image features can shrink in size, resulting in less accurate features.

U.S. Pat. No. 6,492,095 (Samworth) teaches using a pattern of opaque features in a mask to form a pattern of ink-carrying cells (holes) in solid relief areas to improve ink transfer to the printing substrate. Samworth teaches that the cell size should be small enough so that the aggregate volume of ink-carrying cells is less than that of the cells in the inking roller but big enough to form holes in the relief. Samworth suggests a suitable size is approximately 30 microns in diameter corresponding to a cluster of typical (e.g. 2400 DPI or approximately 10 micron) image pixels. Thus, in contrast with Gelbart, Samworth teaches deliberately creating holes in the relief media but only in areas of solid relief.

U.S. Pat. No. 6,731,405 (Samworth) extends the idea to also create ink-carrying cells in other halftone relief features according to the associated tonality. Samworth teaches using smaller or fewer ink-carrying cells in lower-tone features and to vary the size or quantity so that a greater aggregate cell volume is achieved for areas of higher tone than for areas of lower tone.

U.S. Patent Publication No. 2007/0002384 (Samworth et al.) teaches controlling ink film thickness on halftone dots by controlling the dimension of halftone dot relief features. For example, an approximately circular halftone dot will include at least one concentric ring of pixels that receives ink and one concentric ring of pixels that does not receive ink. This is in contrast with U.S. Pat. Nos. 6,492,095 and 6,731,405 (both to Samworth) which teaches creating ink-receptive cells in ink-receptive relief areas.

U.S. Patent Publication No. 2007/0002384 (Samworth et al.) also teach that the dimension of ink-receptive portions of halftone dots should vary to allow different thicknesses of film to be delivered for different tonalities. In particular, Samworth et al. teaches that near 50% tone, ink film thickness should be increased by increasing the dimension of ink-receptive portions of halftone features. Further, Samworth et al. teaches increasing the dimension (e.g. ring width) to make a smooth transition to a solid ink-receptive area for 100% tone.

U.S. Pat. No. 6,701,847 (Weichmann) teaches varying ink density on the printed substrate by superimposing a basic halftone image raster with a fine microraster to reduce the quantity of transferred ink. The microraster serves to reduce the area coverage of image areas (e.g. create holes in the printed image) to reduce the quantity of transferred ink. Weichmann further teaches varying the microraster to provide a gentle transition in reduced area coverage from a maximum amount at full tone to a minimum amount at some lower tone. Weichmann teaches, for example, the use of a checkerboard microraster with 5 micron by 10 micron holes arranged in a checkerboard pattern to achieve a 50% area coverage and corresponding ink density reduction.

Thus, it is clear from the prior art that creating a pattern of holes in halftone data can be used for a variety of purposes. It is not clear from the prior art why seemingly similar techniques produce significantly different results in the printing plate and printed image. It may be that some techniques produce different results for different printing processes. From empirical study of the state of the art of relief printing, however, it is clear that there is room for improvement.

For example, accurate representation of halftone relief features throughout the tonal range is still a challenge. In particular, it is desirable that relief features have relatively steep shoulders in order to resolve very fine features and to provide a precise delineation of relief boundaries. It is also desirable that printed ink densities range from a maximum amount for full tone image areas to minimal amounts in the extreme highlight tonal areas. It is also desirable that printed tonality vary with nearly a linear correlation to requested tonality. It is also desirable that ink be transferred with a uniform appearance in areas of consistent tonality.

SUMMARY OF THE INVENTION

The present invention provides a system and method for producing a relief image article that, when used in a printing process, produces a printed image with good image accuracy, dynamic range, ink density uniformity, and tonal linearity.

According to one aspect of the invention, a pattern can be applied to substantially all image feature sizes of the halftone image data to reduce the transparency of image areas of a mask by a constant amount. The resultant mask can be affixed to a plate precursor to form an intimate contact with, and a gaseous barrier to, the plate precursor. The plate precursor can then be exposed to curing radiation and the mask removed. After processing, the precursor forms a relief plate carrying a relief image that resolves the pattern in the surface of relief features. Solid ink densities are substantially maintained or increased when the pattern is applied to solid relief features.

According to another aspect of the invention, the pattern comprises an arrangement of nearly opaque and nearly transparent features. In preferred embodiments, the opaque features reduce image area transparency by at least 25%. In one preferred embodiment the opaque features reduce image area transparency by approximately 50%.

According to preferred embodiments of the invention, the pattern comprises a regular pattern of opaque features each of which is of a size smaller than 10 microns by 10 microns. In one preferred embodiment, the opaque feature size is approximately 10 microns by 5 microns. In one preferred embodiment, the regular pattern comprises a checkerboard pattern of opaque features.

According to another aspect of the invention, the pattern can be applied to nominal halftone data representing image features larger than a minimum size corresponding to a very small halftone dot. In one preferred embodiment, the minimum size corresponds to a halftone dot corresponding to tonality of 3% at a resolution of 2400 DPI. In another preferred embodiment, the predetermined size corresponds to halftone image features with an effective diameter of at least 30 microns.

According to some embodiments of the invention, the pattern can be excluded from certain areas of halftone features. For example, the pattern may be excluded from perimeter pixels. As another example, the pattern may be excluded from small feature protrusions.

These and other aspects of the present invention are illustrated in the detailed description of the invention.

BRIEF DESCRIPTION OF THE DRAWINGS

FIGS. 5A and 5B are micrographs of exemplary shoulder angles of relief features according to the prior art and the present invention.

FIGS. 6A-6E are micrographs of exemplary portions of relief plates produced according to the present invention.

DETAILED DESCRIPTION OF THE INVENTION

Figure 1A:
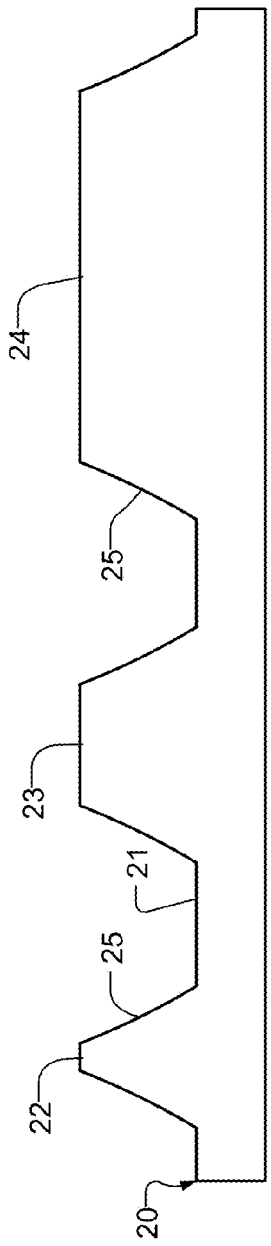
FIGS. 1A and 1B are diagrams illustrating an exemplary relief plate and precursor according to the prior art.

FIG. 1A is a diagram illustrating an exemplary relief plate 20 according to the prior art. For example, relief plate 20 can be made from photopolymers and used in flexographic printing. Relief plate 20 includes a plate floor 21 which, for example, can be formed from photopolymer material cross-linked by exposure to curing radiation through the back surface. Relief plate 20 also includes relief features 22-24, whose top surfaces are intended to transfer ink to a printing substrate to reproduce image features.

Small relief feature 22 is amongst the smallest relief feature that can reliably transfer ink to the printing substrate. Some of the smallest small relief features 22 may not have sufficient relief height to reliably accept ink. Alternatively, small relief features 22 that are too small may have sufficient relief height but may not reliably transfer ink to the printing substrate. For example, a small relief feature 22 that is too small may be so narrow that it bends or breaks under pressure. Typically, small relief feature 22 corresponds to a halftone dot of less than approximately 3% tonality at about 2400 DPI.

Nominal relief feature 23 represents halftone image features having a nominal size ranging from the minimum (e.g. 3% tonality) to below the maximum (i.e. solid tone). Solid relief feature 24 corresponds to the largest size image feature or solid tone (e.g. maximum ink density per unit area on the printed substrate).

Relief features 22-24 are formed through exposure to curing radiation 9 so that malleable photopolymer is cross-linked into a more stable state. Relief features 22-24 can typically have an approximately conical shape with a shoulder 25. The angle of shoulder 25 can vary somewhat for different features 22-24. Ideally, the angle of shoulder 25 is relatively steep so that the top surface of relief feature 22-24 is precise.

Figure 1B:
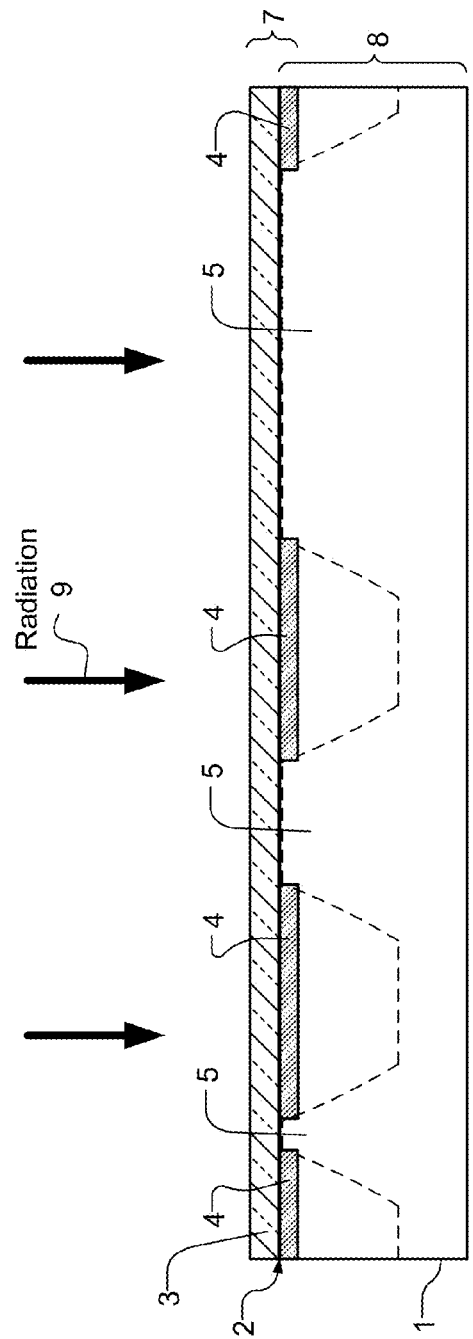

FIG. 1B is a diagram illustrating an exemplary relief plate precursor 1 according to the prior art. Plate precursor 1 can, for example, comprise an uncured photopolymer material. One exemplary embodiment of plate precursor 1 is Flexcell NX flexographic media, manufactured by Eastman Kodak Company. Processing of plate precursor 1 includes at least formation of an image-wise mask 2 and exposure of plate precursor 1 to radiation 9 (e.g. UV light) through mask 2.

Mask 2 can be made from a variety of materials and with a variety of structural compositions. In general, however, mask 2 is a substantially planar article that is typically formed as an integral part of plate precursor 1 or is arranged in close proximity to the surface of plate precursor 1. Mask 2 includes areas that are highly opaque to curing radiation 9 and areas that are relatively transparent to curing radiation 9.

According to preferred embodiments of the invention, mask 2 is initially a separate article and comprises at least a substantially transparent barrier layer 3 and a substantially opaque layer 4. In preferred embodiments, mask 2 is laminated to plate precursor 1 prior to exposure with curing radiation 9. One exemplary embodiment of mask 2 is thermal imaging layer film manufactured by Eastman Kodak Company.

Prior to lamination, however, portions of opaque layer 4 are removed to leave image areas 5 that will allow exposure of plate precursor 1 to curing radiation 9. Portions of opaque layer 4 can be removed by thermal ablation as an example. After exposure to curing radiation 9, plate precursor 1 can be further processed, for example, to remove portions that have not been cured. Areas typically removed below opaque layer 4 are outlined with dashed lines.

Depth dimensions of plate precursor 1 and mask 2 can vary. As an example, plate precursor depth 8 for Flexcell NX media can be in the range of 45-67 mils. As another example, mask depth 7 for thermal imaging layer film can be approximately 6-7 mils with the depth of opaque layer 4 being approximately 1-2 microns. Note that, for the embodiment of thermal imaging layer film laminated to Flexcell NX media, opaque layer 4 at least partially deforms plate precursor 1.

In pursuit of further improvements to laminated Flexcell NX media, the applicants experimented with the composition of image areas 5. In particular, instead of completely removing opaque layer 4 to reveal image area 5, portions of opaque layer 4 were retained in image areas 5 in an attempt to optimize the exposure of relief features 22-24 and in particular to increase the angle of shoulders 25.

A variety of arrangements of opaque features within image areas 5 were evaluated. For example, the opaque coverage area (i.e. percentage of image area 5 covered by opaque portions) was varied. As another example the opaque coverage area was varied according to the size of the corresponding image area 5. As another example, the size of opaque features used for image area 5 was varied. As another example, the positioning of opaque features used for image area 5 was varied (e.g. randomized and regular patterns). As another example, the placement of opaque features in relation to the border of image area 5 was varied. One patterned arrangement of opaque features appeared to provide good improvement in the angle of shoulders 25.

Figure 2:
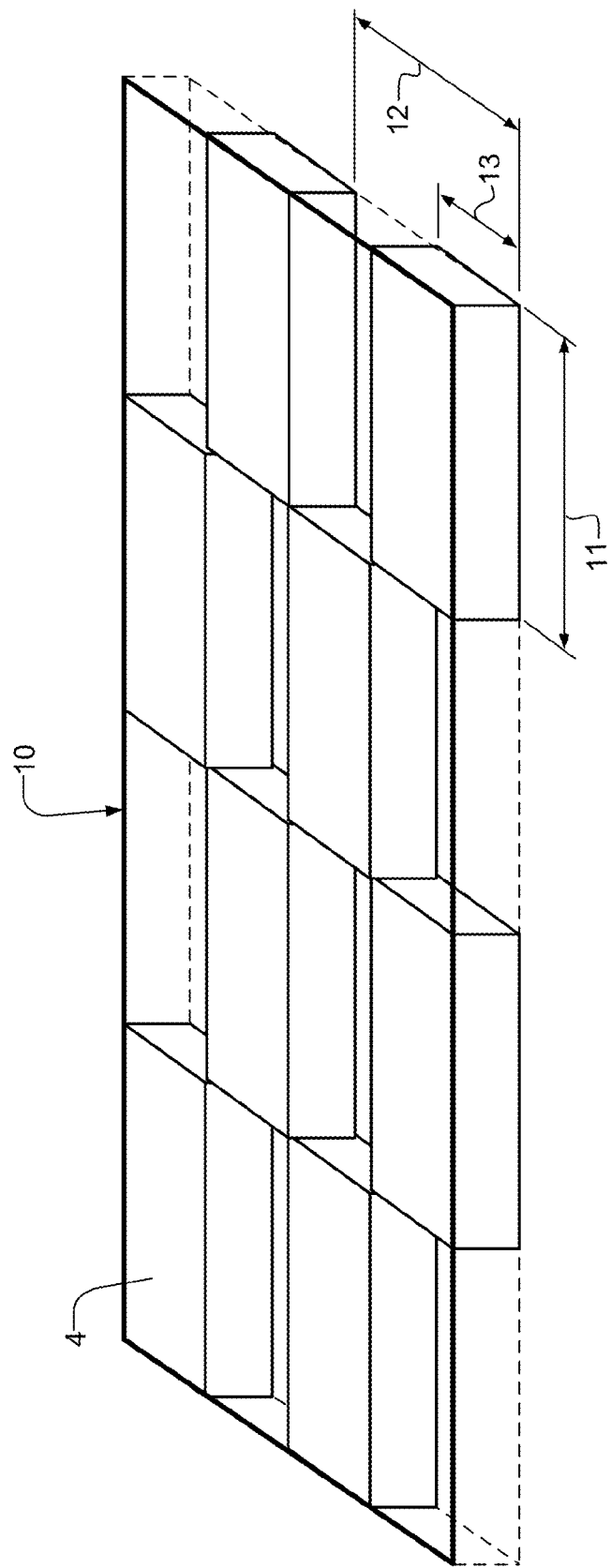
FIG. 2 is a diagram illustrating an exemplary pattern of opaque features according to one preferred embodiment of the present invention.

FIG. 2 is a diagram illustrating an exemplary pattern 10 of opaque features according to one preferred embodiment of the present invention. Pattern 10 comprises a regular arrangement (i.e. checkerboard) of portions of opaque layer 4. For halftone image data with a square resolution of approximately 2400 DPI, certain dimensions of pattern 10 were found to improve shoulder angles. For example, a value of approximately 10 microns was determined for opaque portion width 11. Also, a value of approximately 5 microns was determined for opaque portion length 13. Since halftone image pixel length 12 at 2400 DPI is approximately 10 microns, pattern 10 reduces the transparency of image area 5 by approximately 50%.

Surprisingly, pattern 10 could be applied with good results to most image areas 5. In particular, pattern 10 could be beneficially applied to all but the smallest image areas 5 (i.e. corresponding to small relief feature 22). In one preferred embodiment, pattern 10 could be excluded from certain boundary portions of image area 5.

In one preferred embodiment, application of a pattern can involve a simple post-processing operation performed by a data processor on nominal halftone data. The process can involve first up-sampling the halftone data to 4800 DPI in one dimension. Next, the up-sampled halftone data can be eroded by one pixel at image feature boundaries to produce a secondary halftone data. Isolated image features that have been eroded from the up-sampled data can then be added back to the secondary halftone data. Next, the original up-sampled data can have the checkerboard pattern applied and then be combined with the modified secondary halftone data so that very small image features are not patterned. In other embodiments, patterning may be avoided at the boundary of halftone features to more precisely delineate those boundaries.

Figures 3A, 3B:
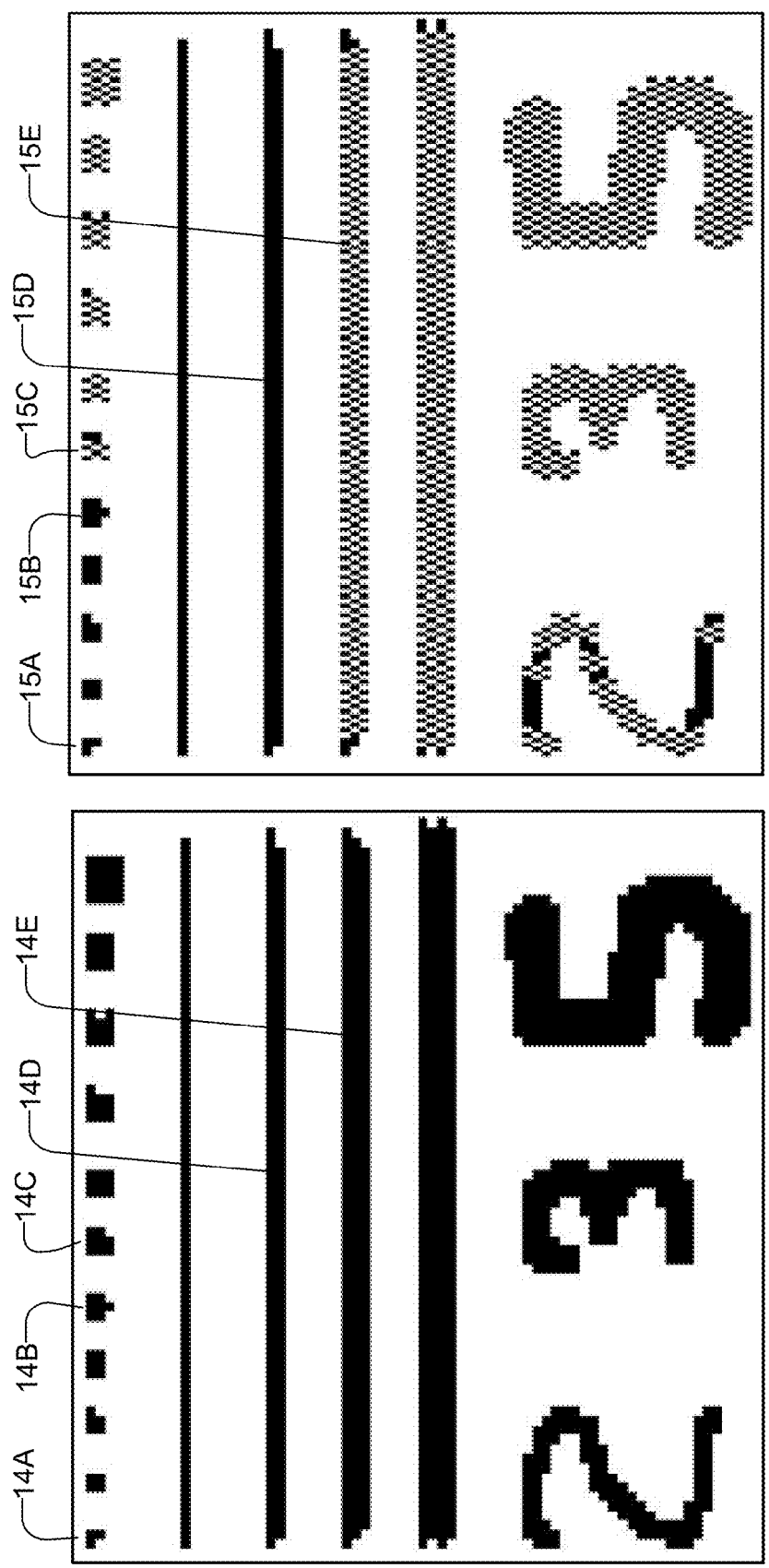
FIGS. 3A and 3B are diagrams illustrating nominal and processed halftone data according to one embodiment of the present invention.

FIGS. 3A and 3B are diagrams illustrating nominal and processed halftone data according to one preferred embodiment of the present invention. FIG. 3A illustrates exemplary nominal halftone data at a resolution of 2400 DPI. Nominal halftone image feature 14A is very small, comprising three adjacent pixels. Nominal halftone image features 14B and 14C are somewhat larger, comprising seven and eight adjacent pixels respectively. Nominal halftone image features 14D and 14E are thin lines with maximum height of two and three pixels respectively. Larger dots, lines, and other solid tone features of varying sizes are also depicted for clarity.

FIG. 3B illustrates the nominal halftone data of FIG. 3A, processed by one preferred pattern processing method of the present invention. The resolution is now 4800 DPI across the page. Processed halftone image features 15A and 15B, corresponding to nominal halftone image features 14A and 14B respectively, are un-patterned but now comprise six and fourteen pixels respectively. Processed halftone image features 15C and 15E are partially patterned in areas where their original dimensions were sufficiently large between boundaries. Processed halftone image feature 15D is un-patterned since nominal halftone image feature 14D is only two pixels high.

AM halftoning generally produces dots of varying sizes in an area to represent tonality. Thus, dots of size approximately 30 microns in diameter will be patterned and substantially all of the halftone dots (e.g. for tonality 3% and above) will be patterned accordingly. FM halftoning generally produces dots of about the same size but with varying density per unit area. In flexography, FM dot sizes can be selected from a range of about 10 microns to 70 microns (or larger). Typically, larger FM dots sizes (25 microns or larger) are preferred so that patterning would be applied to substantially all FM halftone dots for the larger FM dot sizes.

Figure 4A:
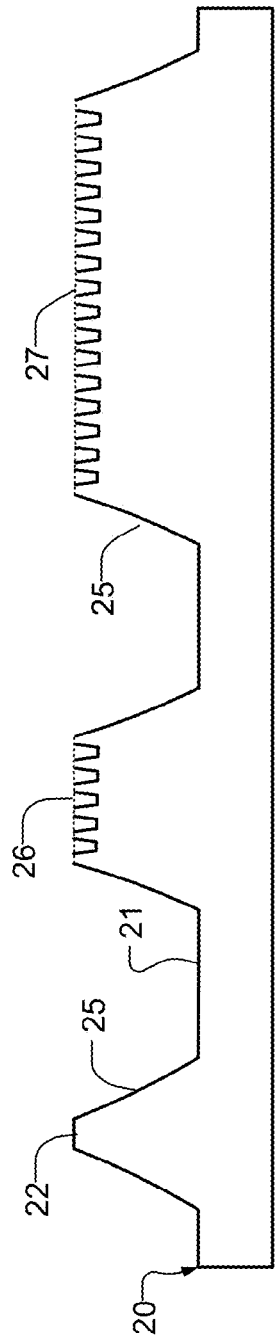
FIGS. 4A and 4B are diagrams illustrating an exemplary relief plate and precursor produced according to the present invention.
Figure 4B:
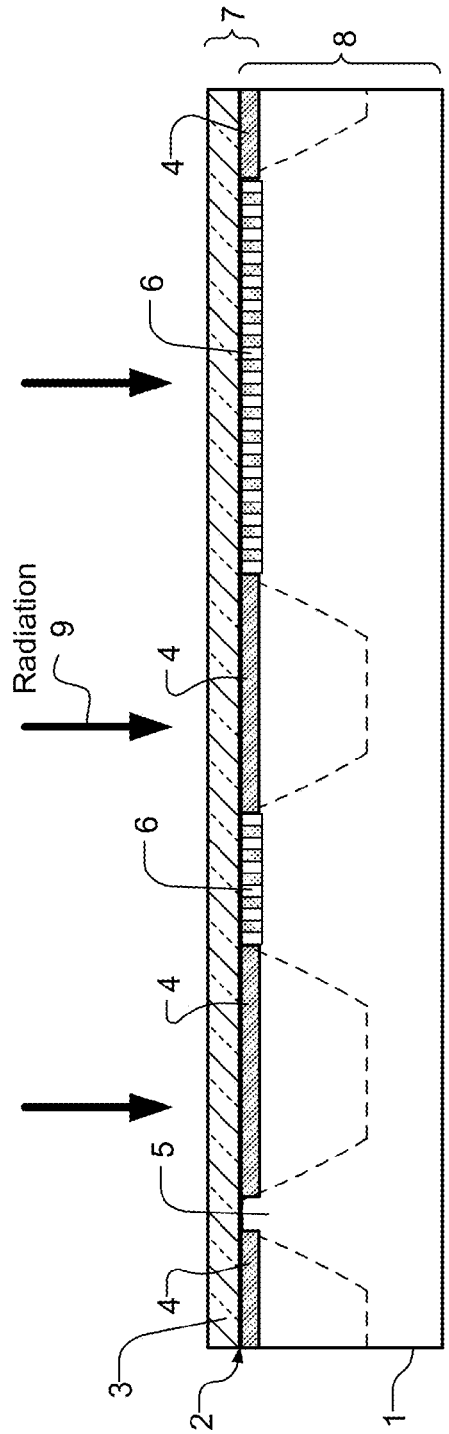

FIGS. 4A and 4B are diagrams illustrating an exemplary relief plate 20 and plate precursor 1 produced according to the present invention. Small relief feature 22 is the same in both prior art and inventive relief plates 20. Patterned nominal relief feature 26 and patterned solid relief feature 27 have pattern 10 resolved in their top surface. Patterned relief features 26 and 27 also have shoulders 25 that are steeper than those of corresponding relief features 23 and 24 of the prior art. Patterned image areas 6 in FIG. 4B represent corresponding image areas 5 that are modified by applying pattern 10 to opaque layer 4 in those areas.

Note that scale of features in FIGS. 3A, 3B, 4A, and 4B are not exact. Empirically, the applicants have found that for an opaque layer 4 with a depth of approximately 1 micron, corresponding depressions of approximately 2-3 microns are formed by pattern 10 in patterned relief features 26 and 27.

FIG. 5A depicts cross section 30 of a portion of a Flexcell NX printing plate produced according to the prior art. Adjacent nominal relief features 23 were produced by exposing the plate precursor through a laminated thermal imaging layer mask produced with nominal halftone data. Nominal relief features 23 include shoulders 25 having shoulder angle 35A.

FIG. 5B depicts cross section 31 of a portion of a Flexcell NX printing plate produced according to one embodiment of the present invention. Adjacent highlight image patterned nominal relief features 26 were produced by exposing the plate precursor through a laminated thermal imaging layer mask produced with processed halftone data. Processing was consistent with the methods describe above for applying pattern 10. Patterned nominal relief features 26 include shoulders 25 having shoulder angle 35B, which is approximately 20% steeper than shoulder angle 35A.

Figure 6B:
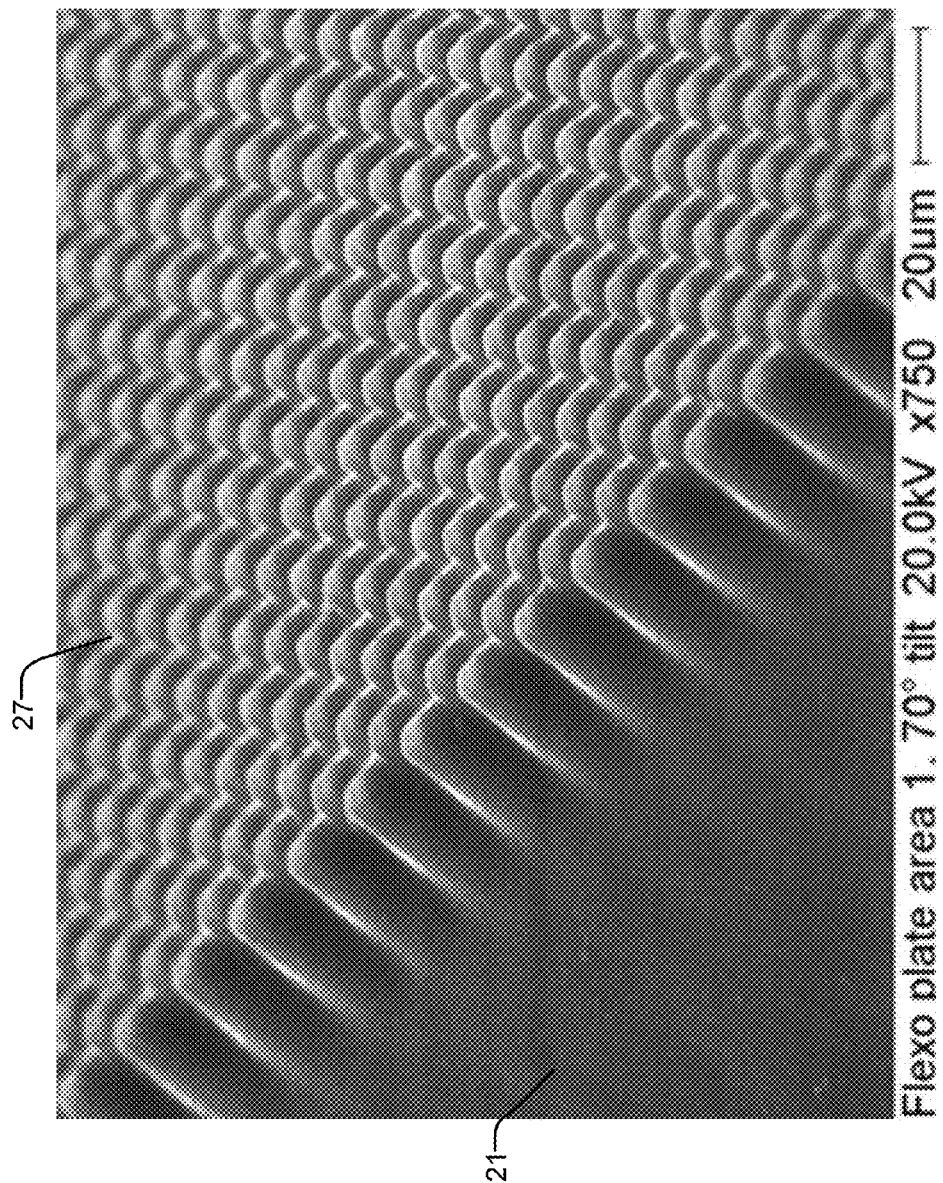

FIGS. 6A-6E are micrographs of exemplary portions of relief plate 20 produced according to the present invention. FIG. 6A depicts a portion of a first relief plate 20 corresponding to a portion of reverse text. That is, patterned solid relief feature 27 transfers ink while the plate floor 21, corresponding to the text character, does not carry ink and thus a reverse image of the text is formed on the printing substrate. At magnification of 100×, one can begin to see pattern 10 resolved in patterned solid relief feature 27.

Figure 6C:
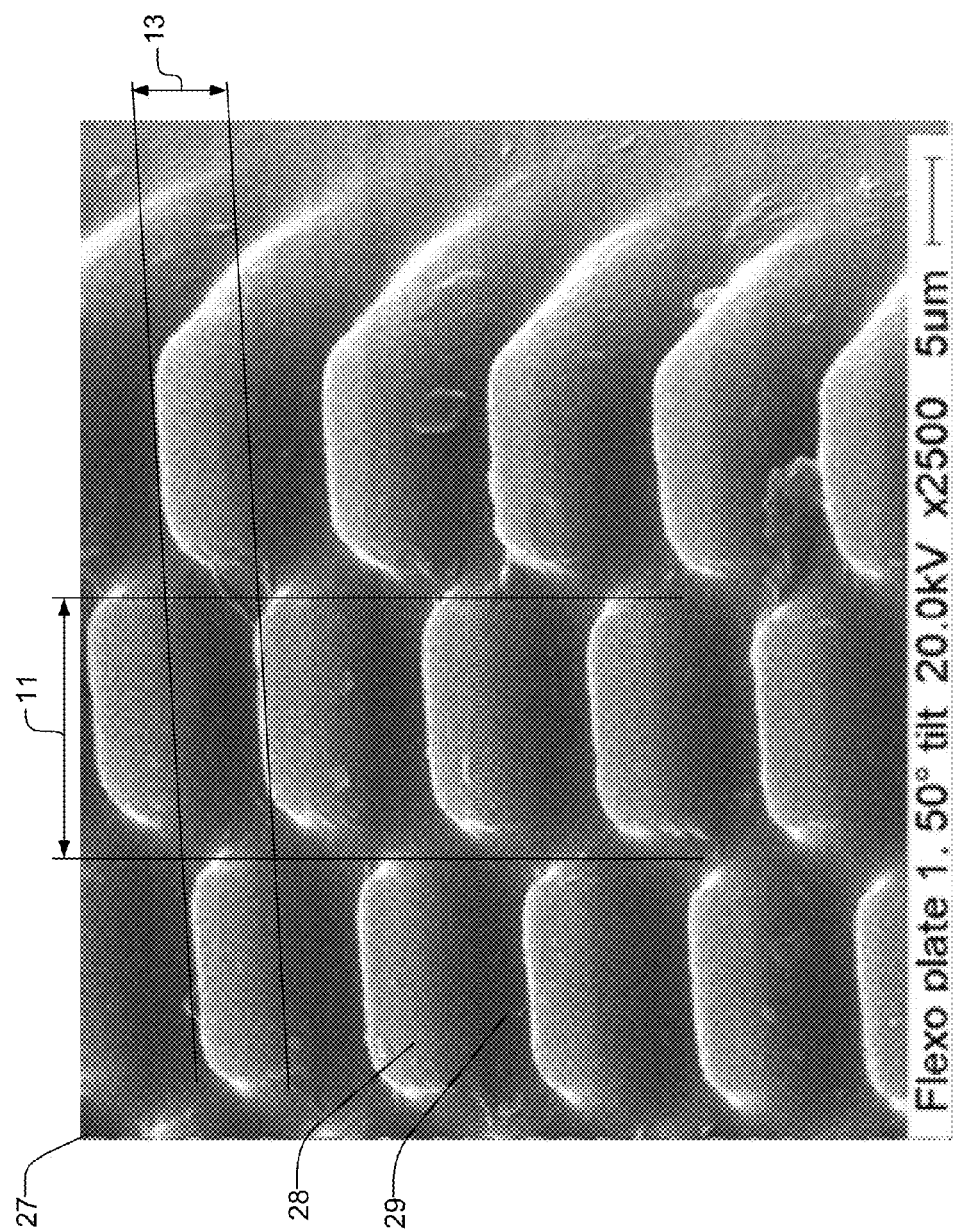
Figure 6D:
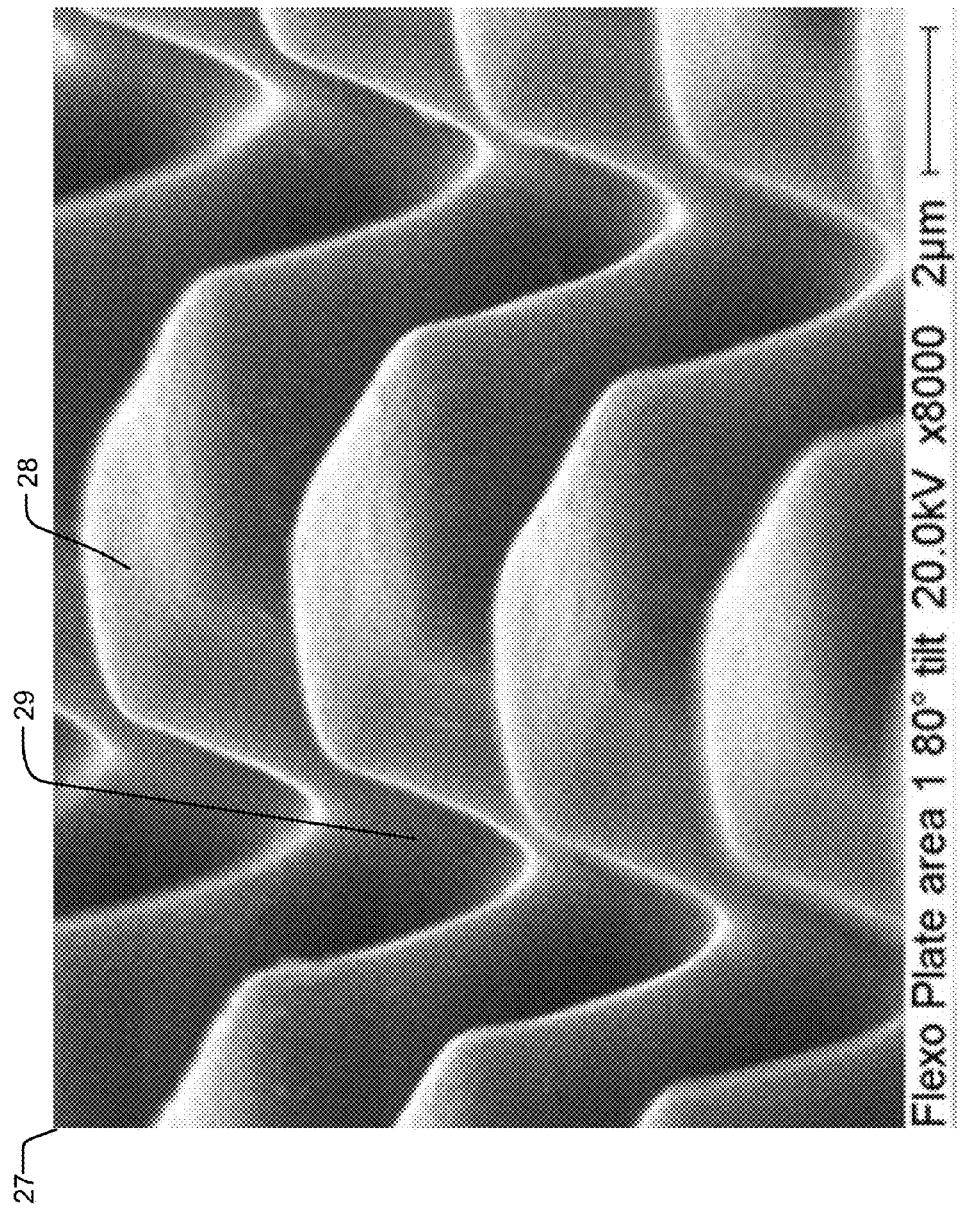

FIG. 6B depicts a 750× magnified view of patterned solid relief feature 27 and plate floor 21. The appearance of regular pattern 10 is now easier to discern in patterned solid relief feature 27. FIG. 6C depicts a 2500× magnified view of patterned solid relief feature 27. At this magnification, it is apparent that relief surfaces 28 and relief depressions 29 have geometries that are highly correlated with pattern 10. In particular, relief depressions 29 correspond to opaque portions of pattern 10 while relief surfaces 28 correspond to transparent portions of pattern 10. For increased clarity, FIG. 6D depicts an 8000× magnified view of patterned solid relief feature 27. Relief surfaces 28 are relatively smooth and flat.

FIG. 6E depicts a 500× magnified view of highlight portions of a second relief plate 20 produced according to the present invention. In particular, relief plate 20 includes small relief features 22, produced without pattern 10, and patterned nominal relief features 26, produced with pattern 10. Clearly, patterned nominal relief features 26 resolve pattern 10 while features 22 are relatively flat and smooth. Although difficult to accurately measure with the 70 degree tilt, shoulder angle 35B of feature 26 appears to be steeper than shoulder angle 35A of small relief feature 22. In particular, shoulder angle 35B appears to be approximately 10% steeper than shoulder angle 35A.

The foregoing description clearly shows the intended effect of shoulder angles 35A and 35B by applying pattern 10 to image areas 5. Although resolving pattern 10 in relief features 26-27 of relief plate 20 was surprising, the resulting improvements in print quality were even more surprising. In particular, when compared with the prior art approach, printed ink densities were effectively maintained or improved across entire tonal range. Further, the uncalibrated tonal response of the printing process was more linear with the use of pattern 10 than without.

Figure 7:
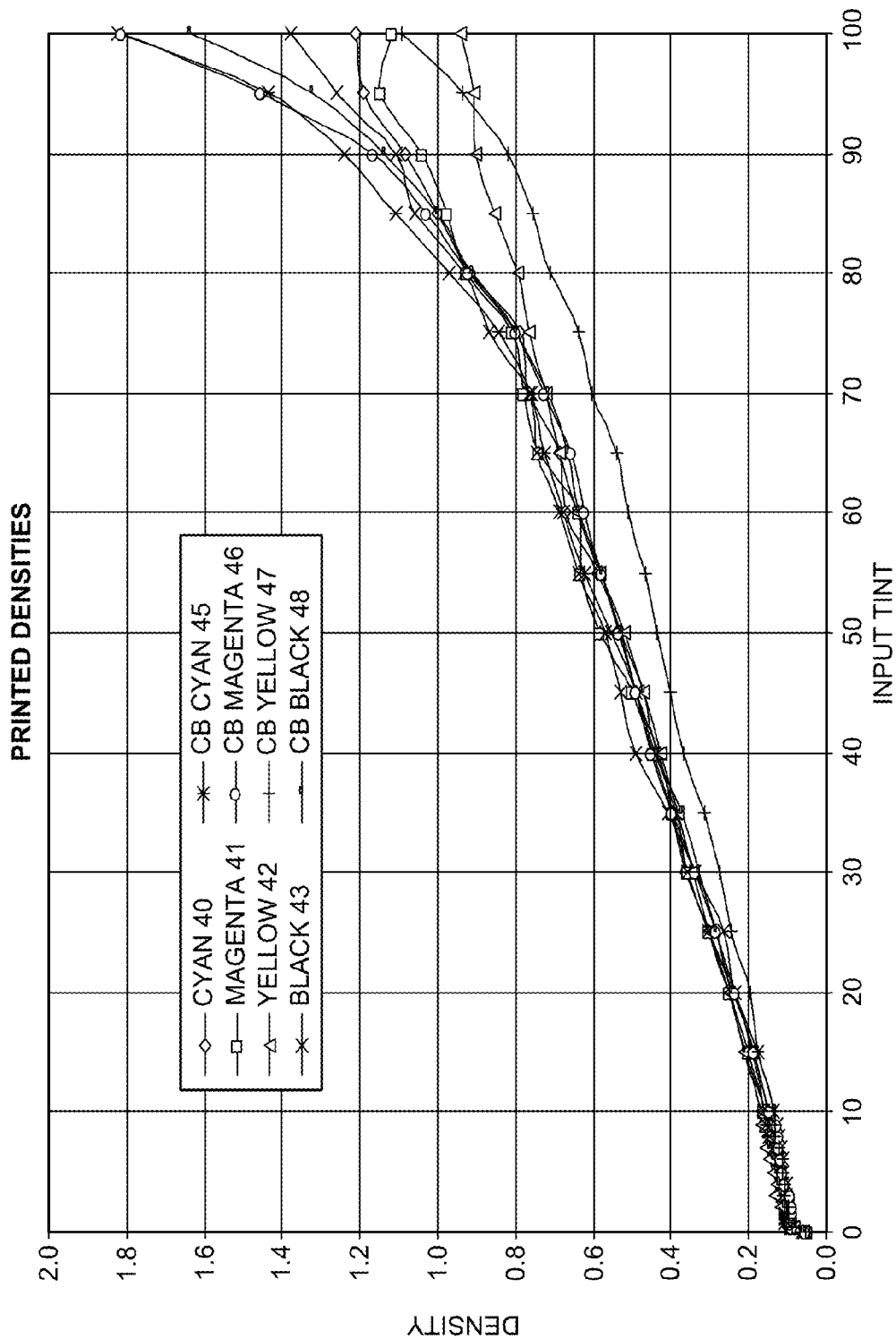
FIG. 7 is a graph illustrating exemplary printed ink densities according to the prior art and the present invention.

FIG. 7 is a graph illustrating exemplary printed ink densities according to the prior art and the present invention. The graph depicts average ink densities measured by a densitometer for each process colorant for a range of constant tint patches. The patches were printed using a single plate including relief features produced with and without pattern 10. Ink density values 40-43 correspond to patches produced according to the prior art. Ink density values 45-48 correspond to patches produced according to the present invention.

Since small relief features 22 are the same for both approaches, the ink densities for the lowest tints are the same, as expected. Throughout the remaining highlight and midtones, the ink densities for both nominal relief feature 23 and patterned nominal relief feature 26 increase monotonically as desired. Except for the yellow colorant, the ink densities produced throughout the highlight and shadow tones are similar for both nominal features 23 and 26. However, approaching and at solid tone, relief features 26 and 27 produce significantly higher ink densities that relief features 23 and 24 respectively. Thus, using pattern 10 throughout substantially the entire tonal range produces improved ink density results.

Figure 8:
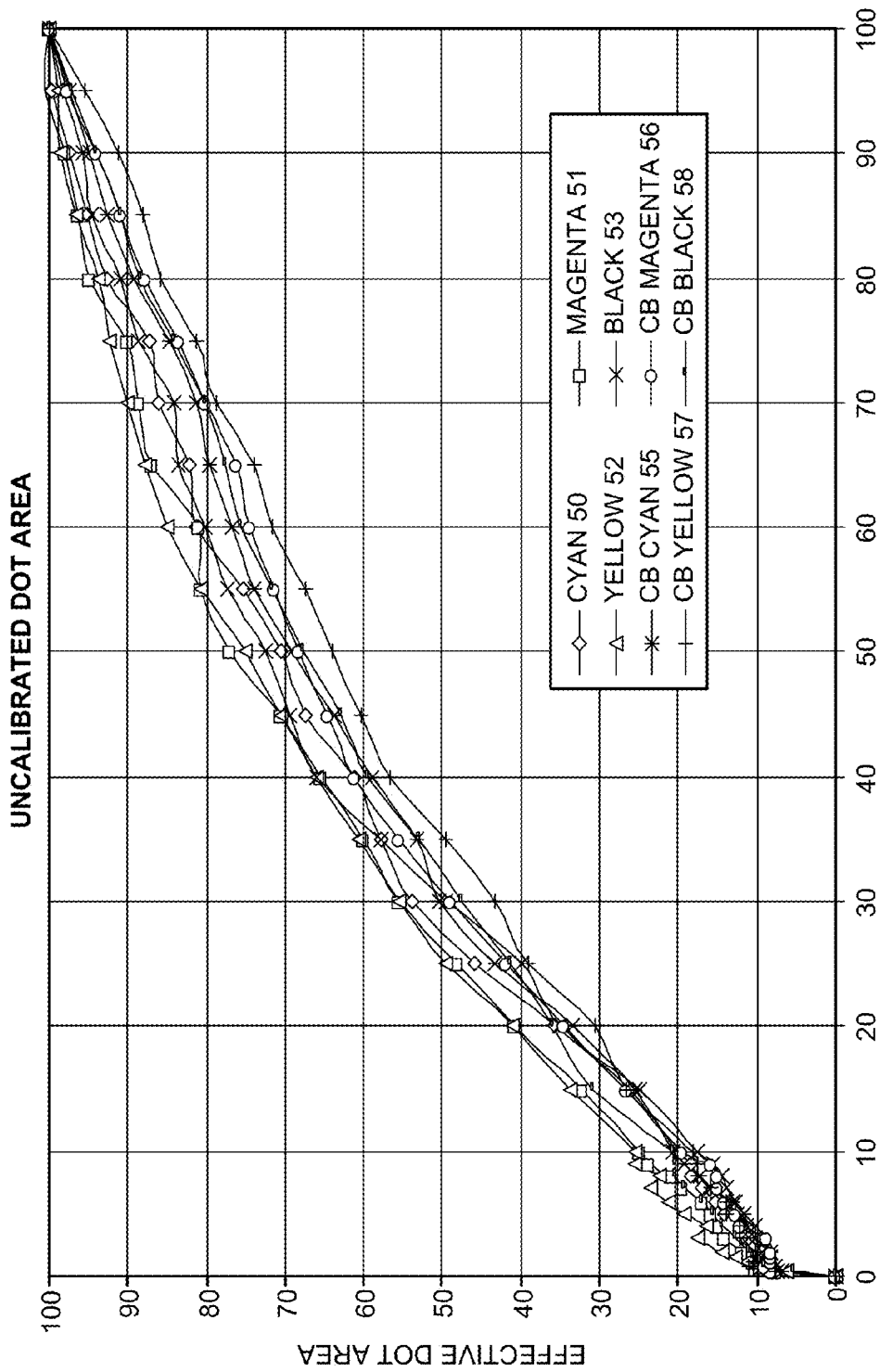
FIG. 8 is a graph illustrating exemplary uncalibrated tonal response according to the prior art and the present invention.

FIG. 8 is a graph illustrating exemplary uncalibrated tonal response according to the prior art and the present invention. FIG. 8 was produced using the Murray/Davies dot area formula, to estimate effective dot area values from ink density measurements of FIG. 7. Dot areas 50-53 correspond to patches produced according to the prior art. Dot areas 55-58 correspond to patches produced according to the present invention. Patterned nominal relief features 26 appear to generally incur less dot gain than nominal relief features 23 and thus provide a more linear uncalibrated tonal response.

Figure 9B:
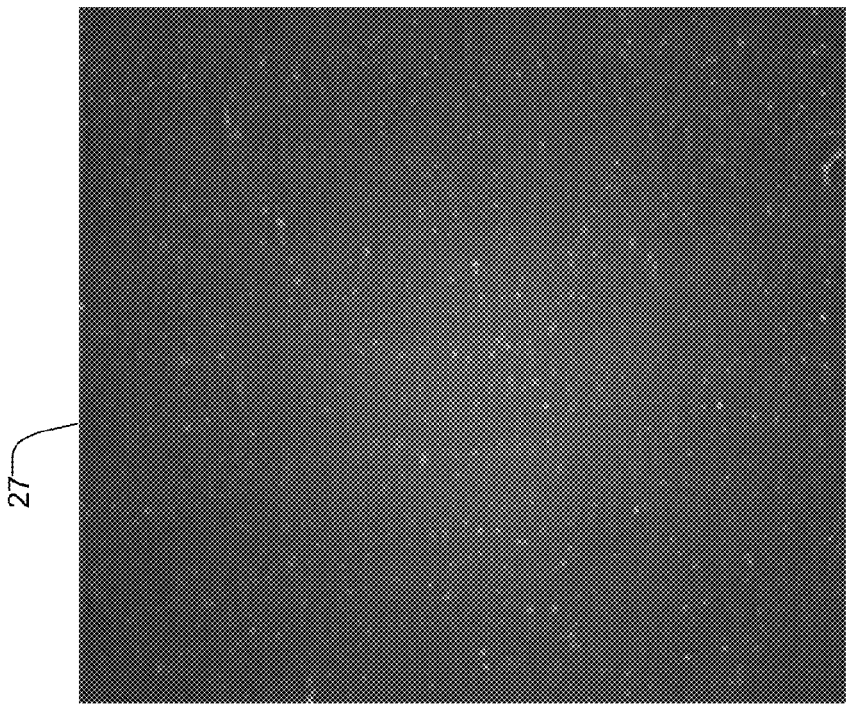
FIGS. 9A and 9B are micrographs of solid image areas of an exemplary printed substrate according to the prior art and the present invention respectively.
Figure 9A:
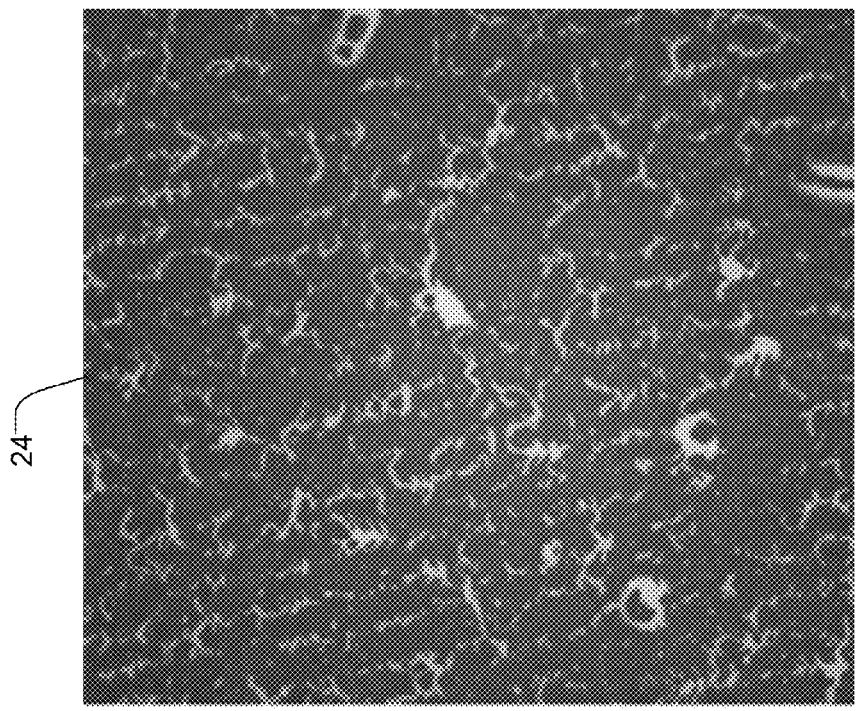

FIGS. 9A and 9B are micrographs of solid image areas of an exemplary printed substrate according to the prior art and the present invention respectively. Clearly, in addition to improved ink density, the distribution of ink is much more uniform when printing with patterned solid relief feature 27 as compared with solid relief feature 24.

Figures 10A, 10B:
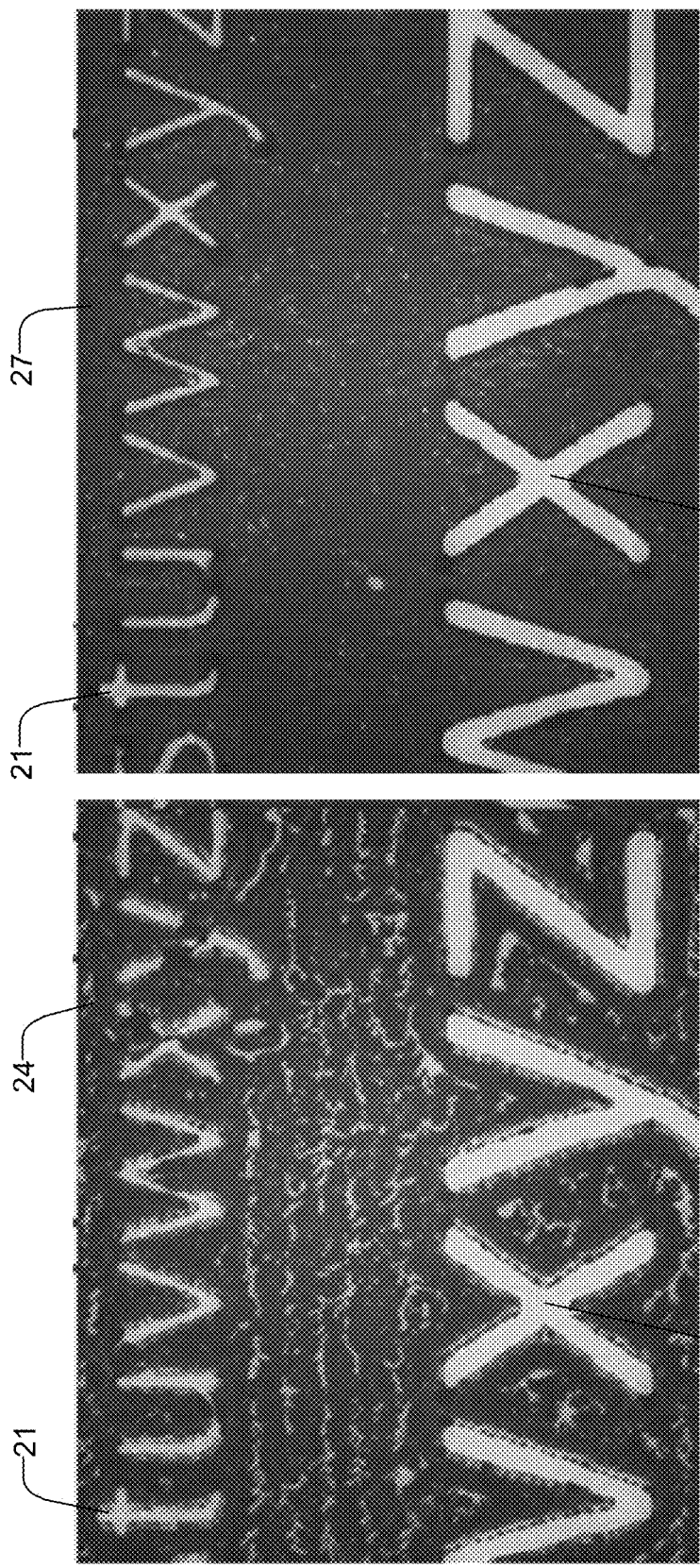
FIGS. 10A and 10B are micrographs of negative text features of an exemplary printed substrate according to the prior art and the present invention respectively.

FIGS. 10A and 10B are micrographs of negative text features of an exemplary printed substrate according to the prior art and the present invention respectively. Clearly, solid inked areas produced by patterned solid relief features 27, surrounding the negative text are uniformly dense and have precisely formed edges, indicative of steep shoulders.

Figure 11B:
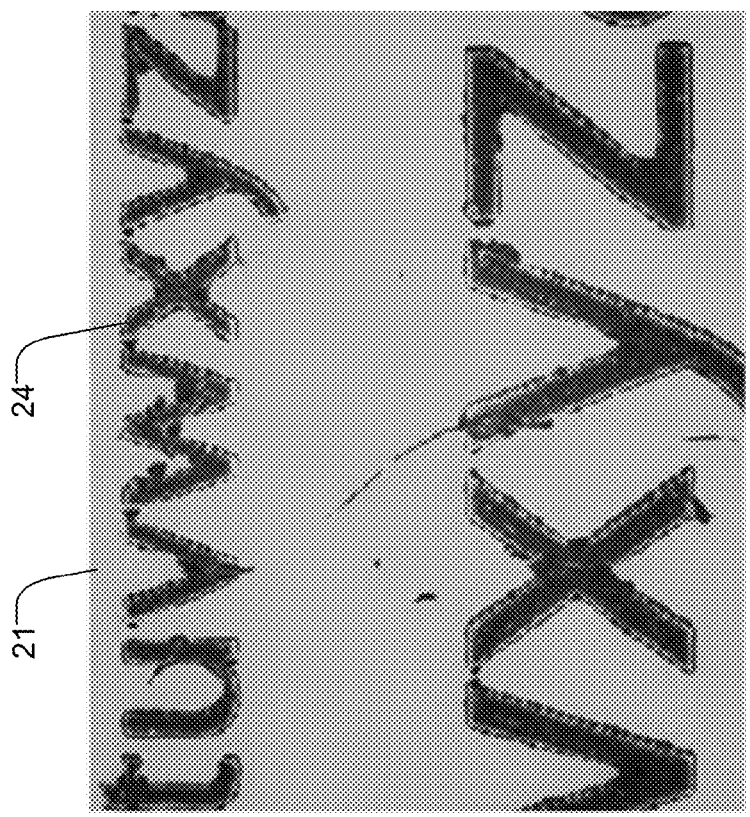
FIGS. 11A and 11B are micrographs of positive text features in non-image areas of an exemplary printed substrate according to the prior art and the present invention respectively.
Figure 11A:
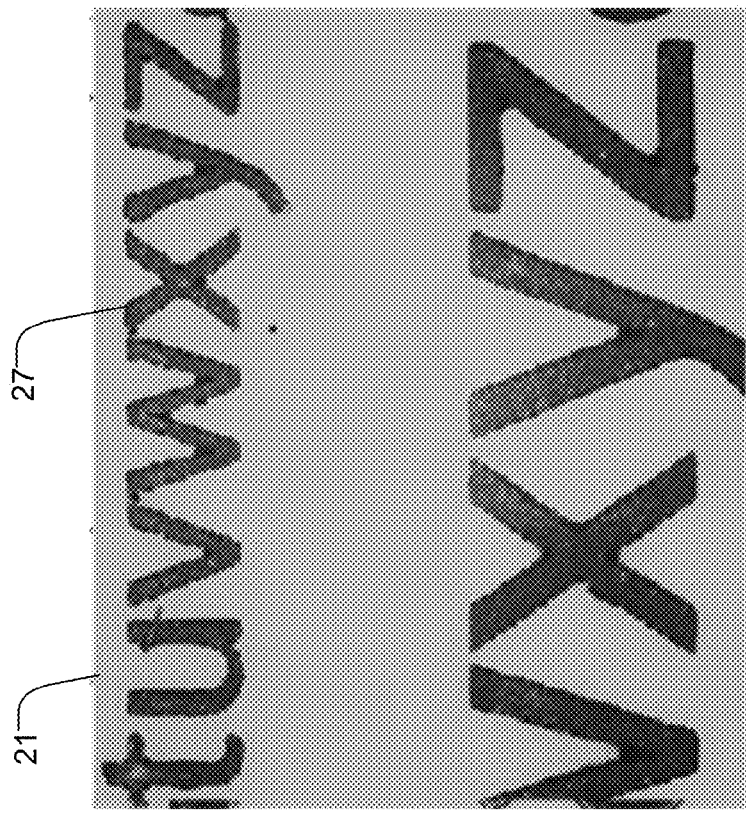

FIGS. 11A and 11B are micrographs of positive text features in non-image areas of an exemplary printed substrate according to the prior art and the present invention respectively. The relative improvement in uniformity and boundary precision is similar to that depicted in FIGS. 10A and 10B.

Figure 12B:
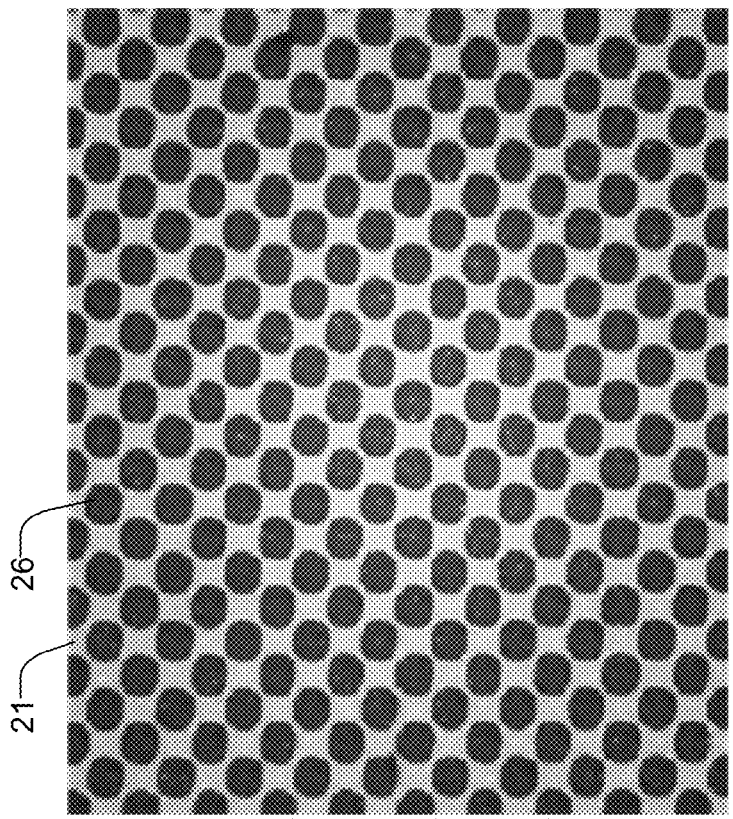
FIGS. 12A and 12B are micrographs of mid-tone image areas of exemplary printed substrate according to the prior art and the present invention respectively.
Figure 12A:
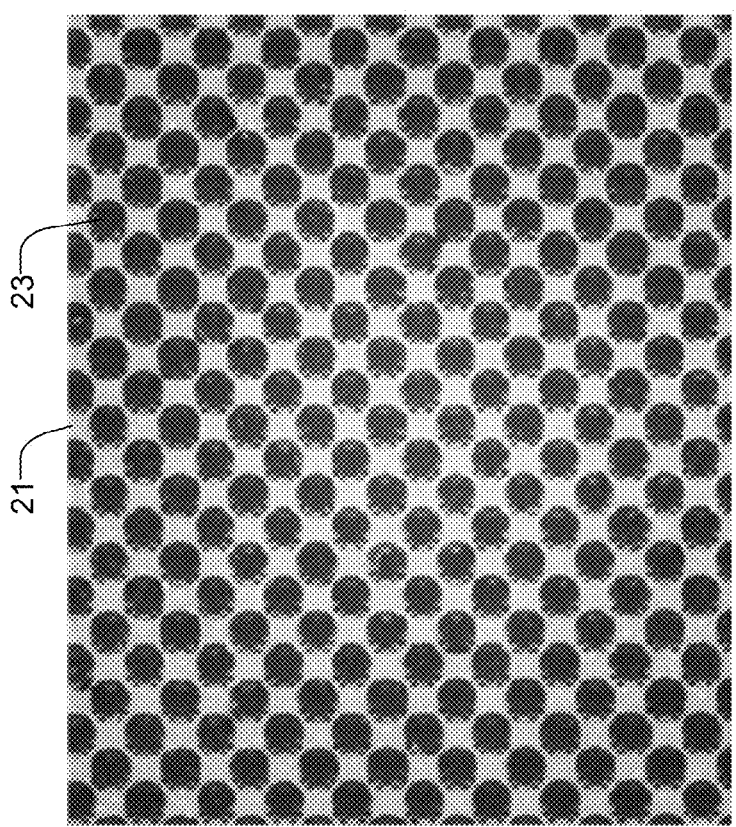

FIGS. 12A and 12B are micrographs of mid-tone image areas of exemplary printed substrate according to the prior art and the present invention respectively. Clearly, the printed halftone dots produced by patterned nominal relief features 26 have more precise boundaries and more uniform ink distribution within those boundaries when compared with the printed halftone dots produced by nominal relief features 23.

Embodiments of the present invention may comprise any medium which carries a set of computer-readable signals comprising instructions which, when executed by a computer processor, cause the computer processor to execute a method of the invention. Embodiments may be in any of a wide variety of forms. Embodiments may comprise, for example, physical media such as magnetic storage media including floppy diskettes, hard disk drives, optical data storage media including CD ROMs, DVDs, electronic data storage media including ROMs, flash RAM, or the like or transmission-type media such as digital or analog communication links. The instructions may optionally be compressed and/or encrypted on the medium.

The invention has been described in detail with particular reference to certain preferred embodiments thereof, but it will be understood that variations and modifications can be effected within the scope of the invention.

PARTS LIST 1 plate precursor
2 mask
3 transparent barrier layer
4 opaque layer 5 image area
6 patterned image area
7 mask depth
8 plate precursor depth
9 curing radiation
10 pattern
11 opaque portion width
12 halftone image pixel length
13 opaque portion length
14A nominal halftone image feature
14B nominal halftone image feature
14C nominal halftone image feature
14D nominal halftone image feature
14E nominal halftone image feature
15A processed halftone image feature
15B processed halftone image feature
15C processed halftone image feature
15D processed halftone image feature
15E processed halftone image feature
20 relief plate
21 plate floor
22 small relief feature
23 nominal relief feature
24 solid relief feature
25 shoulder
26 patterned nominal relief feature
27 patterned solid relief feature
28 relief surface
29 relief depression
30 cross section
31 cross section
35A shoulder angle
35B shoulder angle
40 ink density
41 ink density
42 ink density
43 ink density
45 ink density
46 ink density
47 ink density
48 ink density
50 dot area
51 dot area
52 dot area
53 dot area
55 dot area
56 dot area
57 dot area
58 dot area

The invention claimed is:

1. A method for printing an image, the method comprising:
preparing an image mask based on the image wherein preparing comprises:
obtaining halftone image pixel data of a first nominal resolution corresponding to the image;
increasing the resolution of the halftone image pixel data in at least one pixel dimension;
applying a fixed pixel pattern to all image feature sizes of the halftone data;
processing the image mask based on the processed halftone data;
affixing the image mask to a relief medium precursor;
exposing the relief medium precursor to radiation through the image mask;
producing the relief medium from the relief medium precursor; and
printing the image using relief features of the relief medium;
wherein applying the pattern is designed to provide a constant reduction in transparency in corresponding image areas of the image mask;
wherein producing the relief medium comprises producing a relief medium that resolves the pattern in corresponding relief features;
wherein printing the image comprises printing solid image features with an increased ink density when solid relief features resolve the pattern; and
wherein applying the pattern to all image feature sizes of the halftone data comprises applying the pattern to a halftone image feature with a size at least as large 30 microns in diameter.

2. A method according to claim 1 wherein the fixed pattern comprises a regular pattern.

3. A method according to claim 2 wherein the regular pattern comprises a checkerboard pattern.

4. A method according to claim 1 wherein the nominal resolution of the halftone image data is approximately 2400 DPI.

5. A method according to claim 4 wherein increasing the resolution in at least one dimension comprises doubling the resolution in one dimension.

6. A method according to claim 1 wherein the image mask comprises a transparent barrier layer and an opaque layer.

7. A method according to claim 6 wherein processing the image mask comprises removing portions of the opaque layer based on the halftone data.

8. A method according to claim 1 wherein affixing the image mask to the relief medium precursor comprises laminating the image mask to the relief medium precursor.

9. A method according to claim 1 wherein producing the relief medium from the relief medium precursor comprises removing the image mask from the relief medium precursor.

10. A method according to claim 9 wherein producing the relief medium from the relief medium precursor comprises developing the precursor to remove the unexposed precursor material.

* * * * *